United States Patent
Li et al.

(10) Patent No.: US 10,645,352 B2
(45) Date of Patent: May 5, 2020

(54) OPTICAL PROJECTION MODULE

(71) Applicants: TRIPLE WIN TECHNOLOGY (SHENZHEN) CO.LTD., Shenzhen (CN); HON HAI PRECISION INDUSTRY CO., LTD., New Taipei (TW)

(72) Inventors: Jing-Wei Li, Guangdong (CN); Sheng-Jie Ding, Guangdong (CN); Jian-Chao Song, Guangdong (CN); Shin-Wen Chen, New Taipei (TW)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 143 days.

(21) Appl. No.: 16/051,125

(22) Filed: Jul. 31, 2018

(65) Prior Publication Data
US 2020/0014893 A1 Jan. 9, 2020

(30) Foreign Application Priority Data
Jul. 4, 2018 (CN) .......................... 2018 1 0726447

(51) Int. Cl.
*G03B 21/16* (2006.01)
*H04N 9/31* (2006.01)
*H05K 1/02* (2006.01)

(52) U.S. Cl.
CPC ........... *H04N 9/3144* (2013.01); *G03B 21/16* (2013.01); *H05K 1/0209* (2013.01); *H05K 1/0274* (2013.01)

(58) Field of Classification Search
CPC ...... G03B 21/145; G03B 21/14; G03B 21/16; G03B 21/20; G03B 21/2033; H04N 9/3144; H04N 9/3161; H05K 1/0209; H05K 1/0274
USPC ....................................................... 362/373
See application file for complete search history.

(56) References Cited

U.S. PATENT DOCUMENTS

2019/0281265 A1* 9/2019 Zhang ..................... G06T 7/521

FOREIGN PATENT DOCUMENTS

CN 207133560 U 3/2018

* cited by examiner

*Primary Examiner* — Ryan D Howard
(74) *Attorney, Agent, or Firm* — ScienBiziP, P.C.

(57) ABSTRACT

An optical projection module with improved heat dissipation efficiency includes a circuit board, a semiconductor substrate mounted on a surface of the circuit board, and a light source and an optical member mounted on a surface of the semiconductor substrate opposite from the circuit board. A hollow area is defined in the circuit board and in the semiconductor substrate to draw heat directly away from the light source and thus avoid physical distortion of the hardware which would otherwise reduce the quality of light beams emitted.

12 Claims, 11 Drawing Sheets

OPTICAL PROJECTION MODULE

FIELD

The subject matter herein generally relates to optical projectors.

BACKGROUND

An optical projection module may include a printed circuit board and a light source mounted on the printed circuit board. The light source can generate extensive heat that can be difficult to dissipate. The heat can cause distortion of the light emitted by the light source.

Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
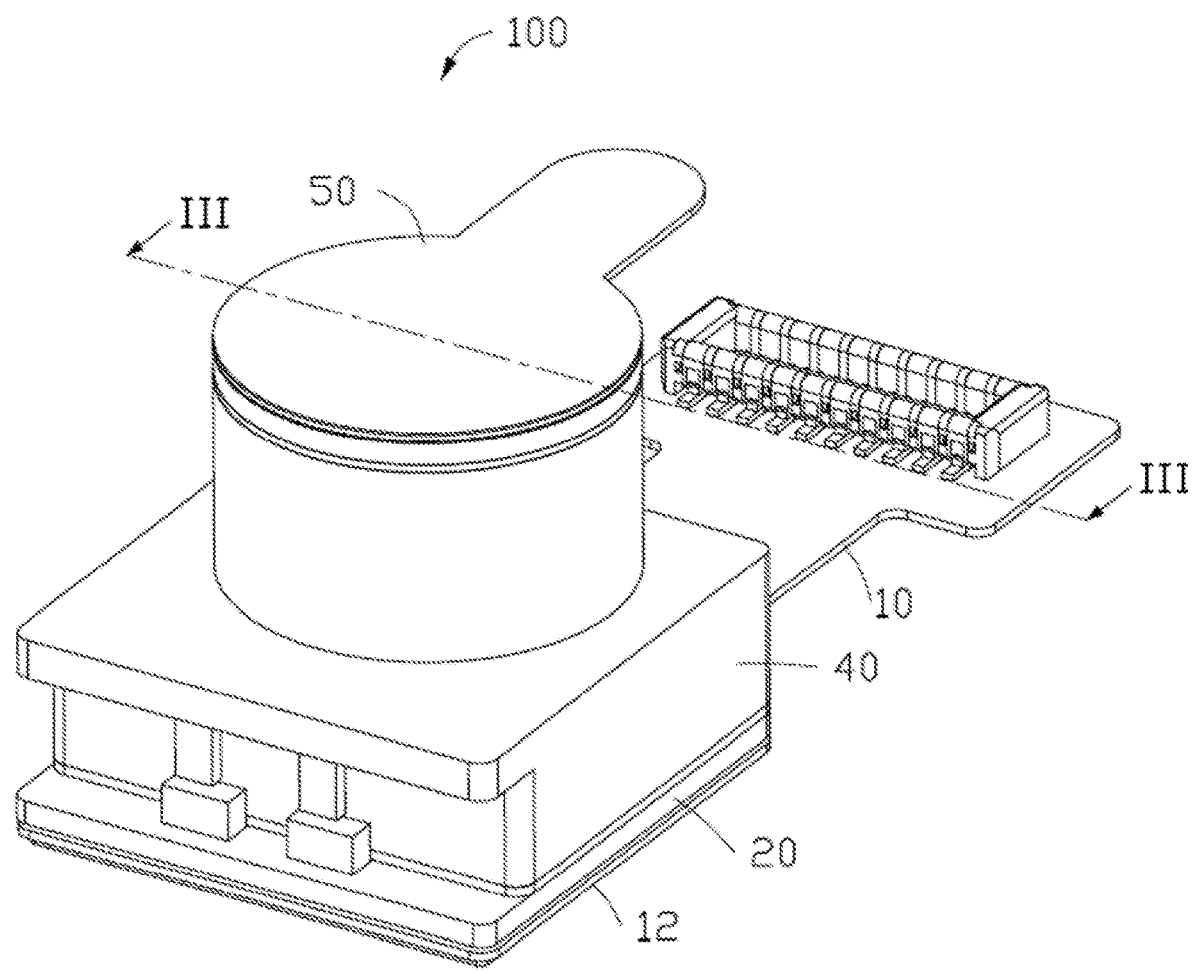
FIG. 1 is an isometric view of an embodiment of an optical projection module according to the present disclosure.
Figure 2:
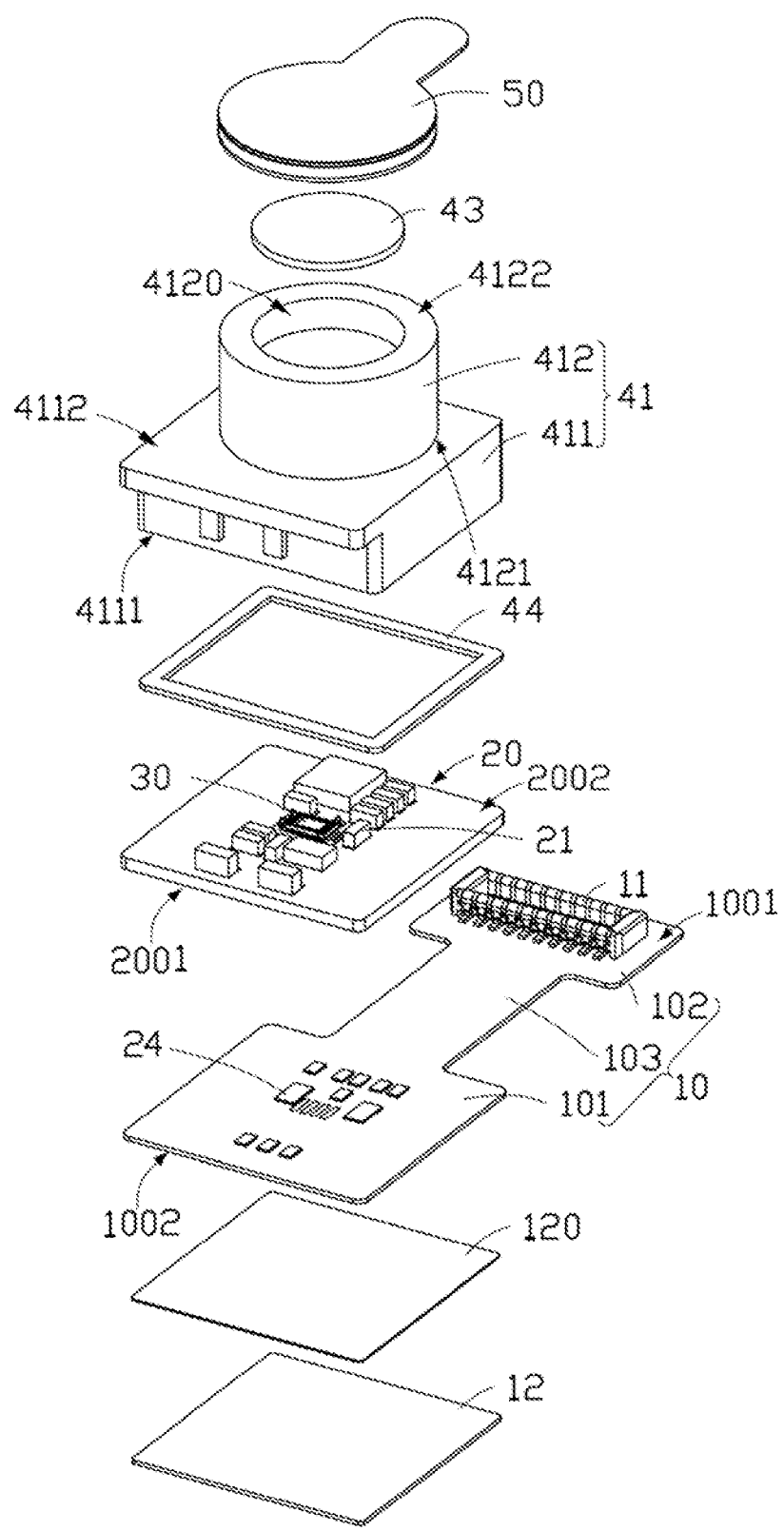
FIG. 2 is an exploded isometric view of the optical projection module of FIG. 1.
Figure 3:
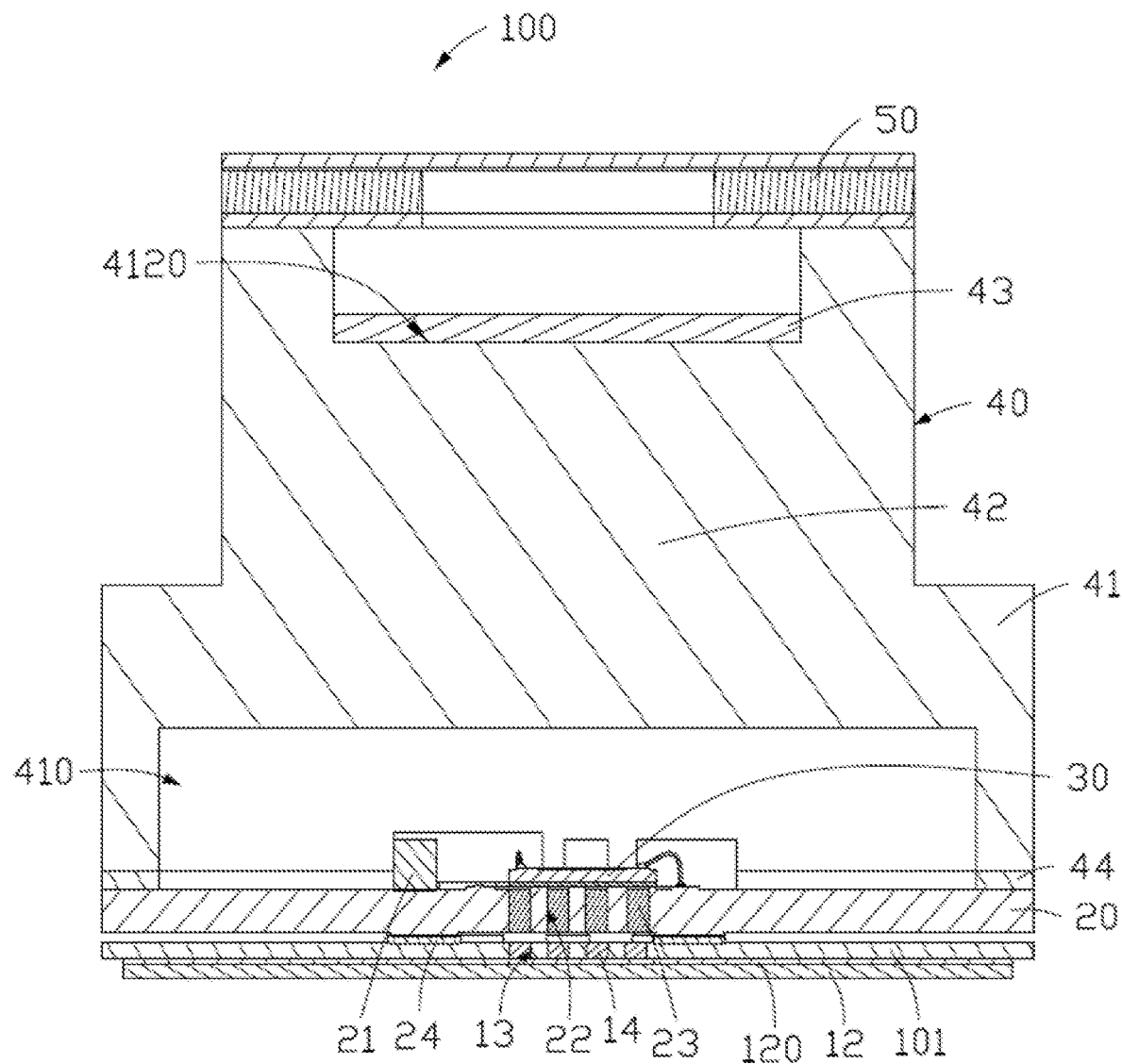
FIG. 3 is a cross-sectional view taken along line of FIG. 1.
Figure 4:
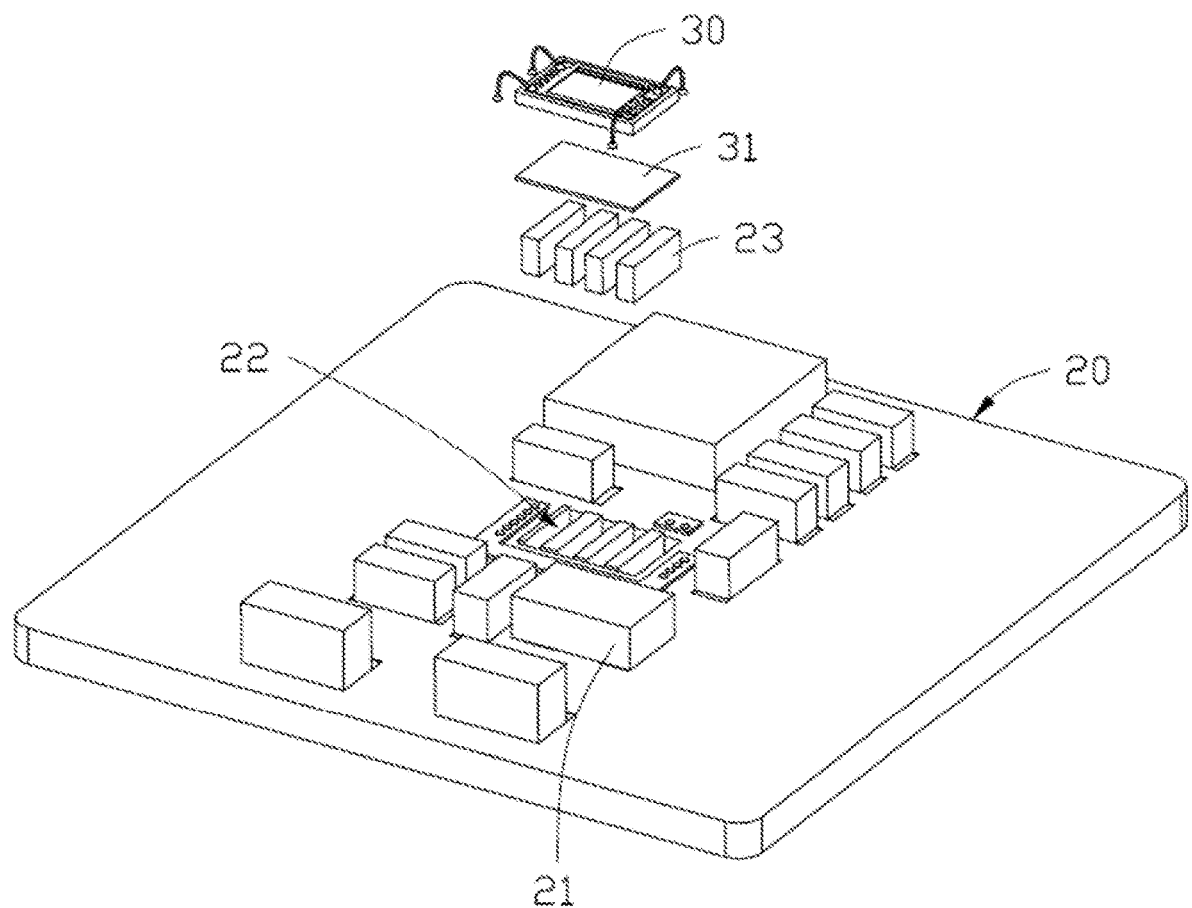
FIG. 4 is an isometric view of a semiconductor substrate of the optical projection module of FIG. 1.
Figure 5:
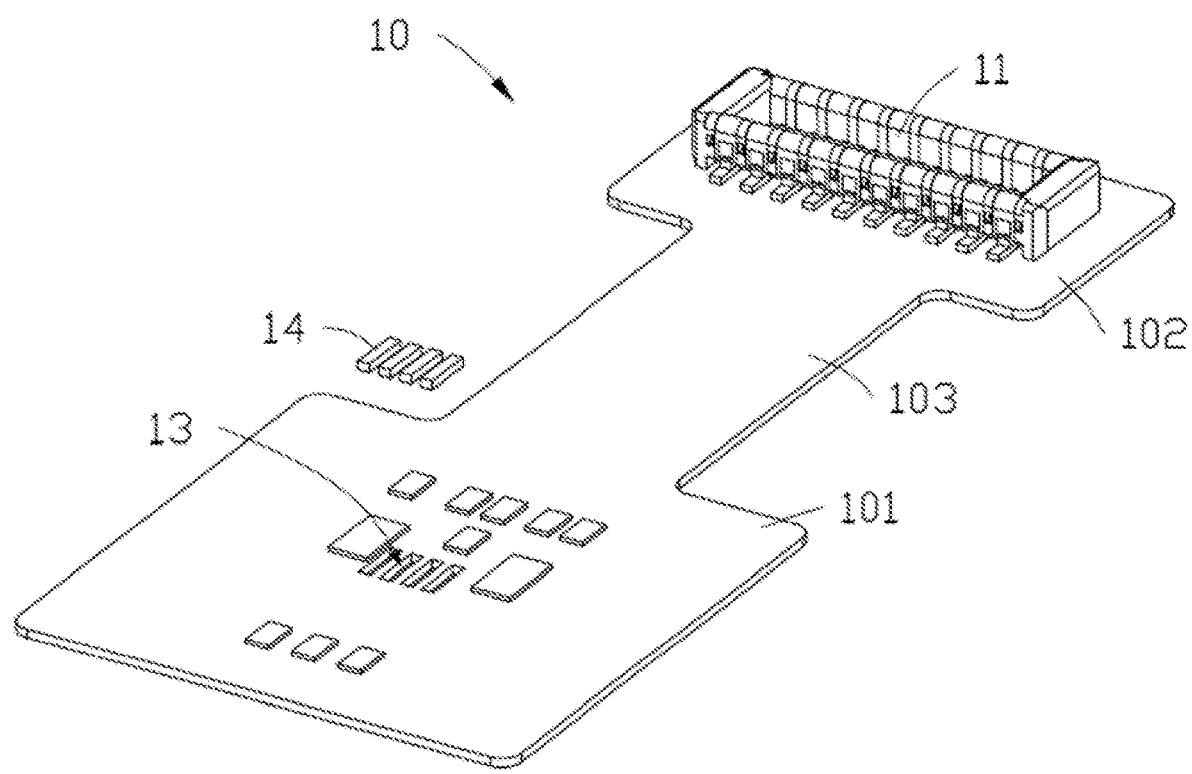
FIG. 5 is an isometric view of a circuit board of the optical projection module of FIG. 1.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIGS. 1 to 5 illustrate a first embodiment of an optical projection module 100. The optical projection module 100 includes a circuit board 10 having a first surface 1001 and a second surface 1002, opposite to the first surface 1001. A semiconductor substrate 20 is mounted on the first surface 1001 of the circuit board 10. The semiconductor substrate 20 has a third surface 2001 facing the first surface 1001 and a fourth surface 2002 opposite to the third surface 2001. A light source 30 and an optical member 40 are mounted on the fourth surface 2002 of the semiconductor substrate 20, in a manner causing the light path direction of light emitted from the light source 30 to be away from the circuit board 10.

The circuit board 10 can be a flexible circuit board, a rigid circuit board, or a rigid-flexible circuit board. In an embodiment, the circuit board 10 is a rigid-flexible circuit board including a first rigid board portion 101, a second rigid board portion 102, and a flexible board portion 103 connected between the first rigid board portion 101 and the second rigid board portion 102. The second rigid board portion 102 has an electronic connecting component 11. The electronic connecting component 11 can be a connector or gold fingers (edge connectors). The optical projection module 100 can be mounted to other electronic devices through the electronic connecting component 11. A reinforcing plate 12 is glued to the second surface 1002 of the circuit board 10 (for example, to the first rigid board portion 101) by a first adhesive layer 120. The reinforcing plate 12 can be made of metal, such as stainless steel. The electronic connecting component 11 and the reinforcing plate 12 can be positioned on different surfaces (e.g., one on the first surface 1001 and one on the second surface 1002) of the circuit board 10.

The semiconductor substrate 20 is connected by a solder paste layer 24 to the first surface 1001 of the circuit board 10 (for example, to the first rigid board portion 101). In an embodiment, the semiconductor substrate 20 can be made of ceramic.

The light source 30 is connected to a center of the fourth surface 2002 semiconductor substrate 20 by a second adhesive layer 31. The light source 20 can emit light beams. The semiconductor substrate 20 defines a plurality of parallel first slots 22 aligned with the light source 20. Each parallel first slot 22 passes through the semiconductor substrate 20. The first rigid board portion 101 defines a plurality of parallel second slots 13 aligned with the parallel first slots 22. Each parallel second slot 13 passes through the first rigid board portion 101. The parallel first slots 22 and the parallel second slots 13 correspond to each other one-to-one in at least one of number and position. Thus, heat generated by the light source 30 can be efficiently delivered to the outside environment through the parallel first slots 22, the parallel second slots 13, and the reinforcing plate 12, thereby improving heat dissipation of the optical projection module 100. The parallel second slots 13 are independent from conductive wires of the circuit board 10. That is, the parallel second slots 13 do not destroy the conductive wires of the circuit board 10.

In an embodiment, each parallel first slot 22 and each parallel second slot 13 can be rectangular. Outermost sides of two outermost parallel first slots 22 can be substantially aligned with two opposite sides of the light source 20. A first silical gel 23 infills each parallel first slot 22. A second silical gel 14 infills each parallel second slot 13. The first silical gel 23 and the second silical gel 14 can further improve the heat dissipation efficiency of the optical projection module 100.

The light source 30 can be one of vertical cavity surface emitting laser (VCSEL), light emitting diode (LED), infrared (IR) LED, and organic LED (OLED). In an embodiment, the light source 30 is a VCSEL that is able to emit light beams with wave lengths at 830 nm or 950 nm or in between. The semiconductor substrate 20 can further include a plurality of electronic components 21 surrounding the light source 30. The electronic components 21 can be resistors, capacitors, diodes, triodes, relays, or electrically erasable programmable read only memories (EEPROMs).

The optical member 40 includes a lens holder 41, a collimation lens 42, and a diffraction optical element (DOE) 43. The collimation lens 42 and the DOE 43 are mounted in the lens holder 41.

The lens holder 41 is glued to the semiconductor substrate 20 by a third adhesive layer 44. The lens holder 41 defines a receiving space 410 for receiving the light source 30 and the electronic components 21.

In an embodiment, the lens holder 41 includes a hollow and substantially square first holding portion 411 and a hollow and substantially circular second holding portion 412. The first holding portion 411 is glued to the third surface 2001 of the semiconductor substrate 20. The first holding portion 411 has a fifth surface 4111 facing the third surface 2001 and a six surface 4112 opposite to the fifth surface 4111. The second holding portion 412 is connected to the fifth surface 4111 of the first holding portion 411. The width of the first holding portion 411 is greater than the width of the second holding portion 412. The receiving space 410 is defined in the first holding portion 411. The collimation lens 42 is positioned between the first holding portion 411 and the second holding portion 412, and closes off an end of the receiving space 410 opposite from the semiconductor substrate 20. The collimation lens 42 collimates the light beams from the light source 30. The collimation lens 42 can be integrally formed with the lens holder 41. The second holding portion 412 has a seventh surface 4121 facing the sixth surface 4112 and an eighth surface 4122 opposite to the seventh surface 4121. The eighth surface 4122 of the second holding portion 412 forms a recess 4120. The DOE 43 is received in the recess 4120, and can diffract the light beams from the collimation lens 42.

In an embodiment, the optical projection module 100 can further include a protection cover 50. The protection cover 50 covers the eighth surface 4122 of the second holding portion 412. The protection cover 50 closes off the recess 4120 to encapsulate the DOE 43 in the recess 4120.

Figure 6:
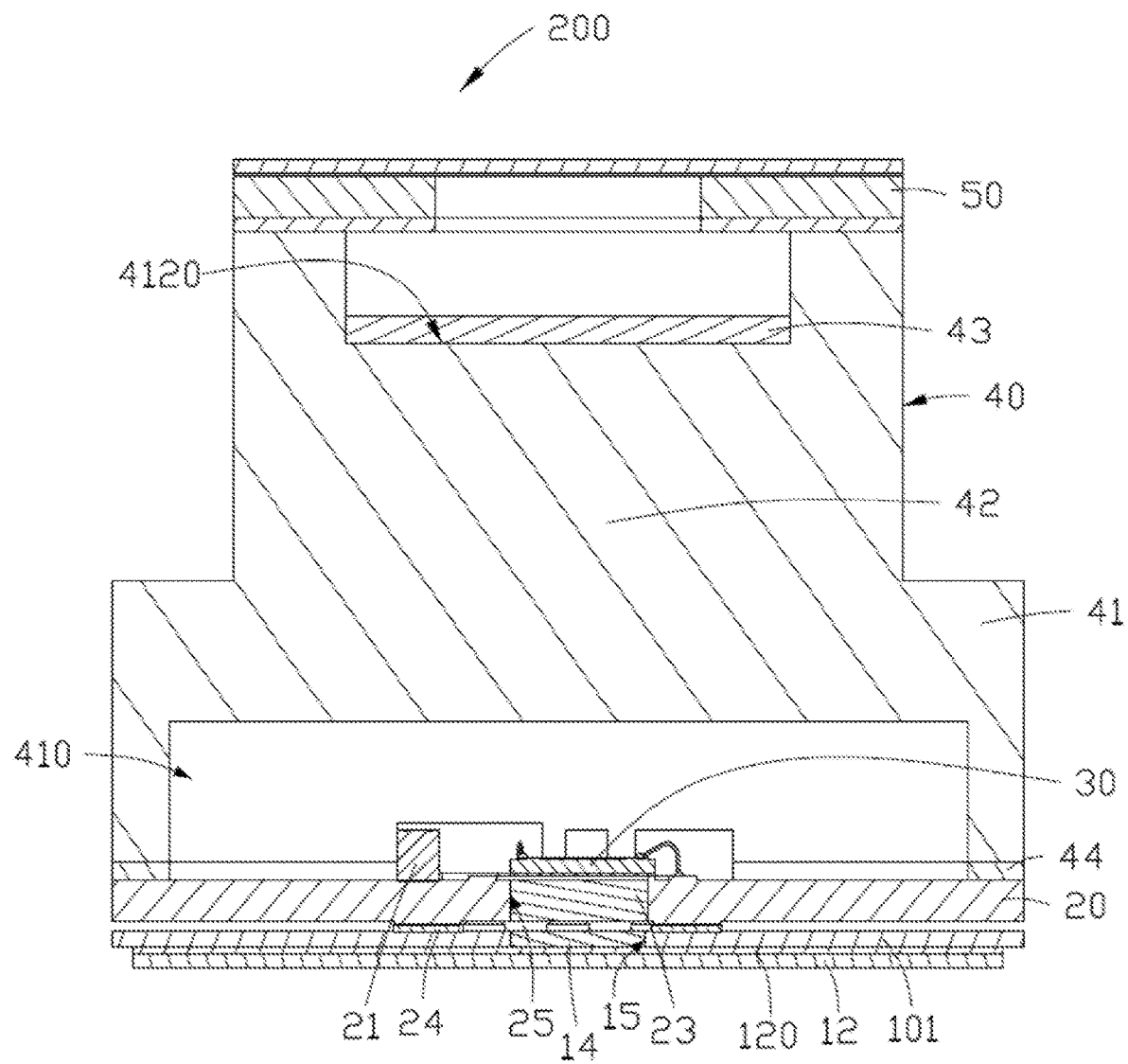
FIG. 6 is similar to FIG. 3, but showing another embodiment of an optical projection module.
Figure 7:
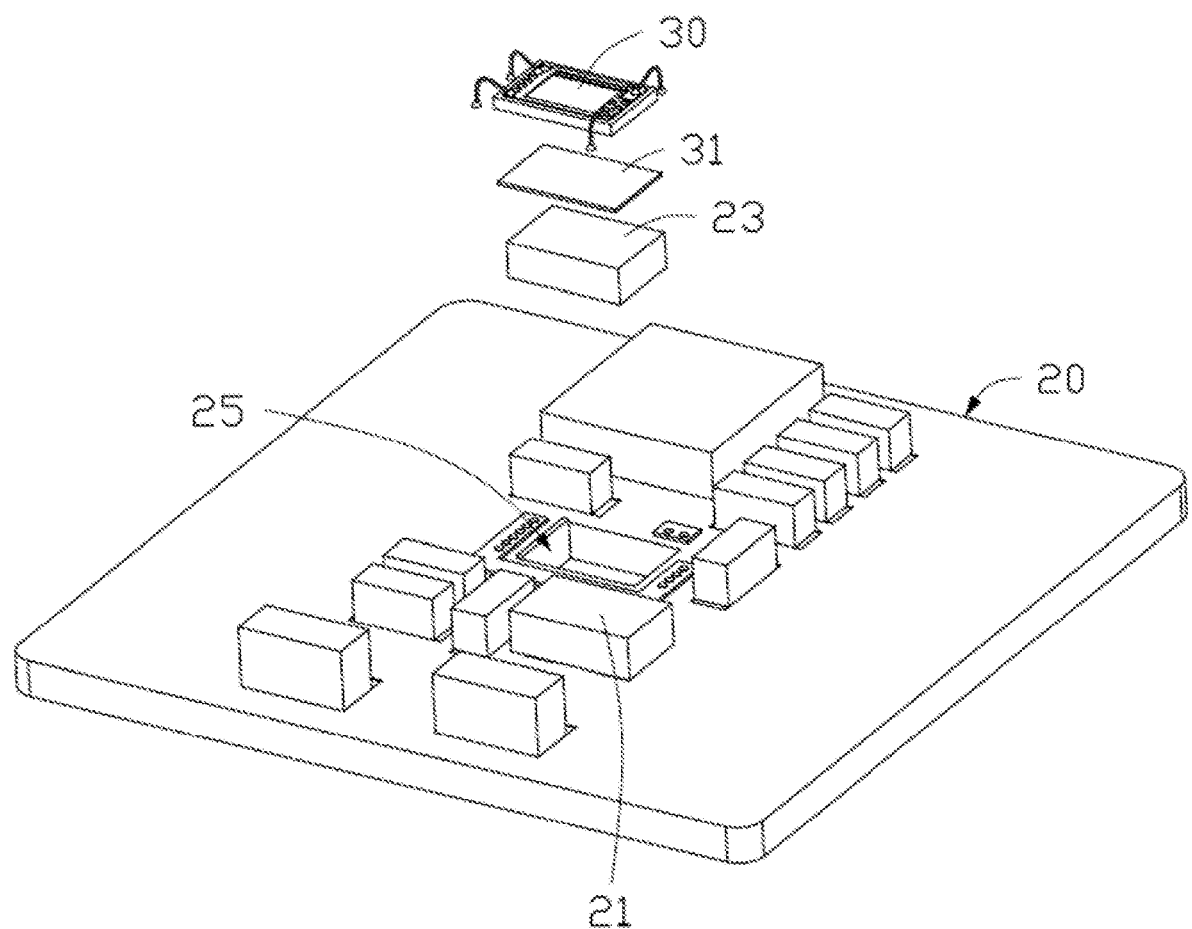
FIG. 7 is an isometric view of a semiconductor substrate of the optical projection module of FIG. 6.
Figure 8:
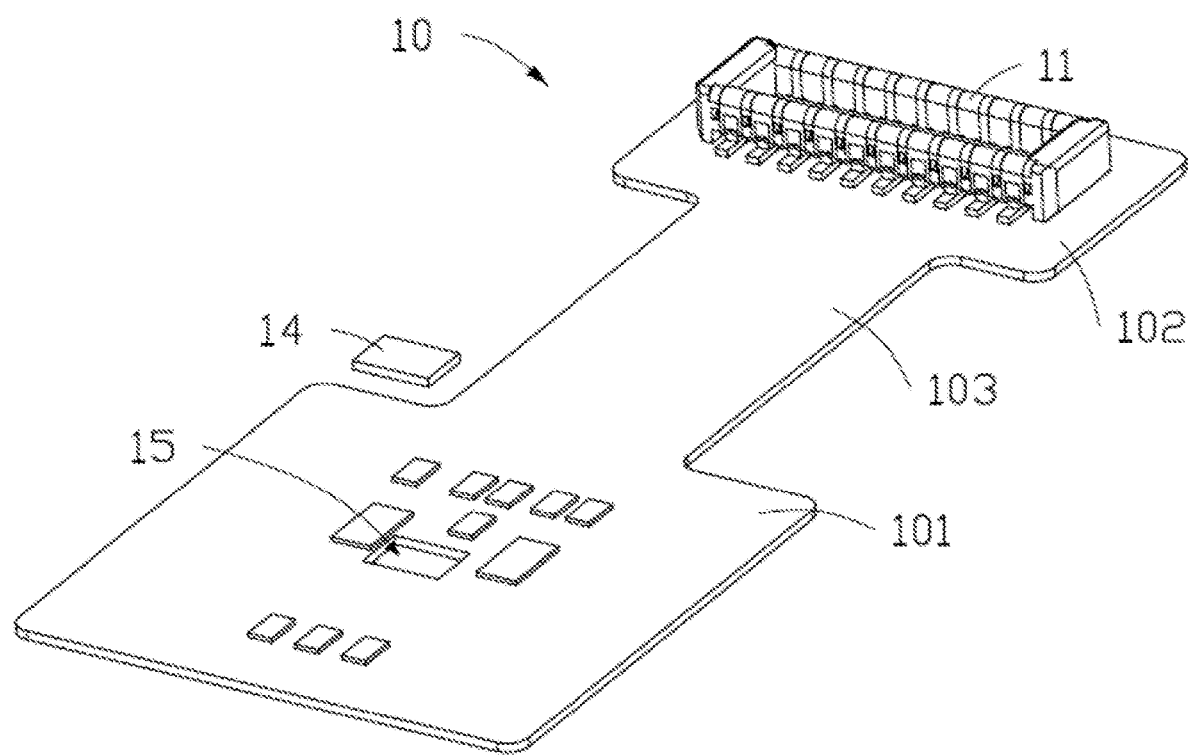
FIG. 8 is an isometric view of a circuit board of the optical projection module of FIG. 6.

FIGS. 6 to 8 illustrate a second embodiment of an optical projection module 200. Different from the optical projection module 100, the semiconductor substrate 20 of the optical projection module 200 defines a first opening 25 aligned with the light source 20. The first opening 25 passes through the semiconductor substrate 20. The first rigid board portion 101 defines a second opening 15 aligned with the first opening 25. The second opening 15 passes through the first rigid board portion 101. The second opening 15 is independent from conductive wires of the circuit board 10, that is, the second opening 15 does not destroy the conductive wires of the circuit board 10.

In an embodiment, the shapes of the first opening 25 and the light source 30 can be the same. The width of the first opening 25 is less than the width of the light source 30 to allow edges defining the first opening 25 to support the light source 30. A first silical gel 23 infills the first opening 25. A second silical gel 14 infills the second opening 15.

Figure 9:
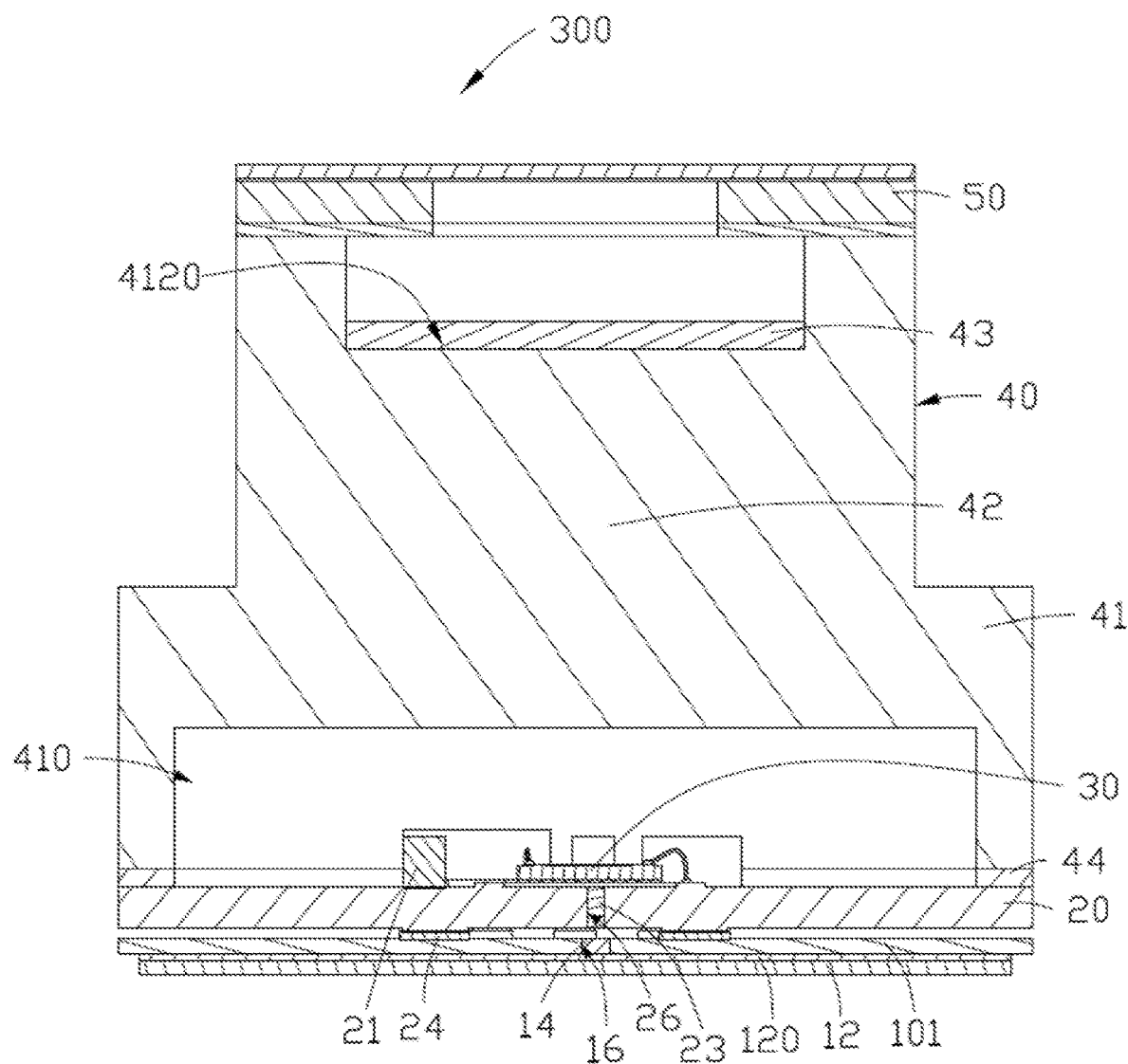
FIG. 9 is similar to FIGS. 3 and 6, but showing yet another embodiment of an optical projection module.
Figure 10:
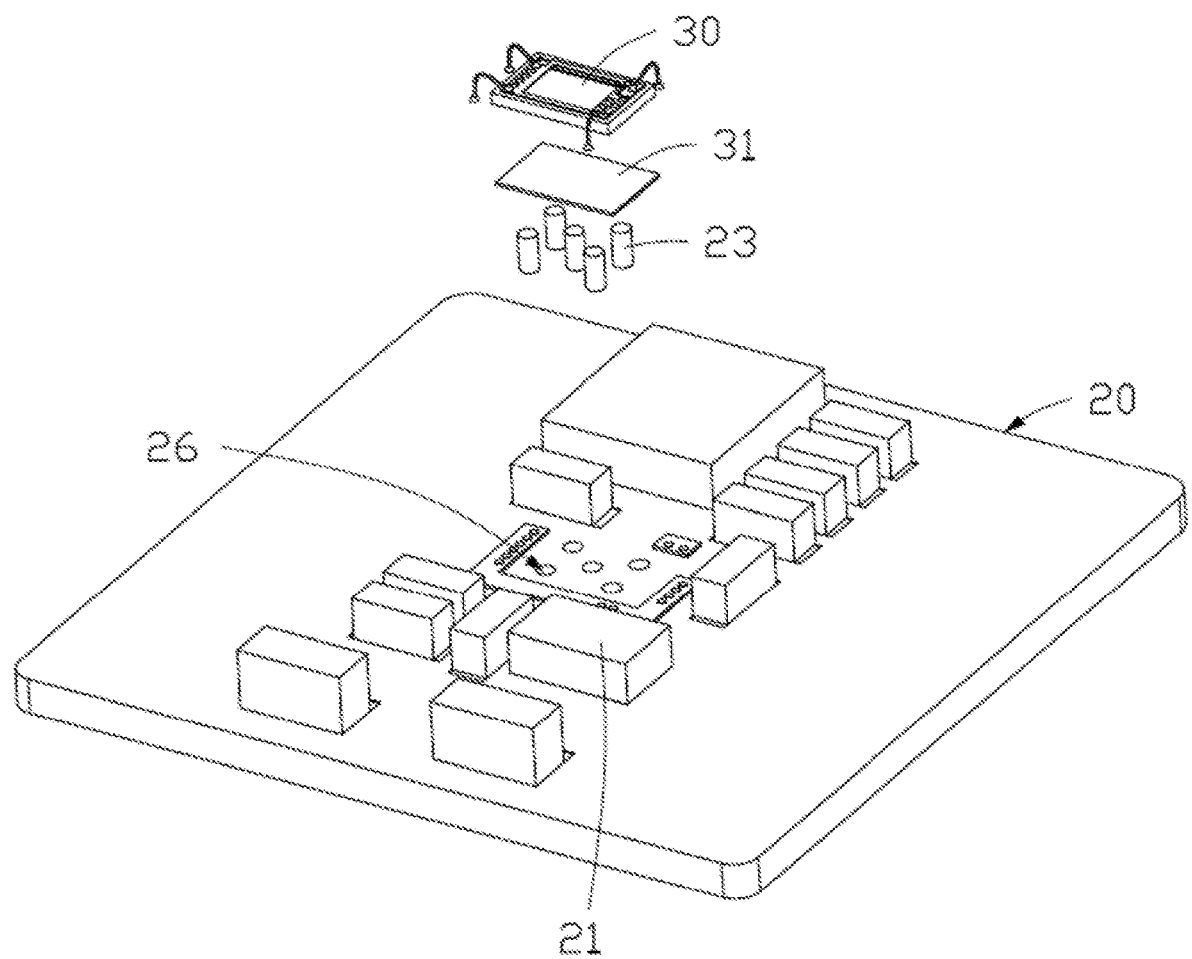
FIG. 10 is an isometric view of a semiconductor substrate of the optical projection module of FIG. 9.
Figure 11:
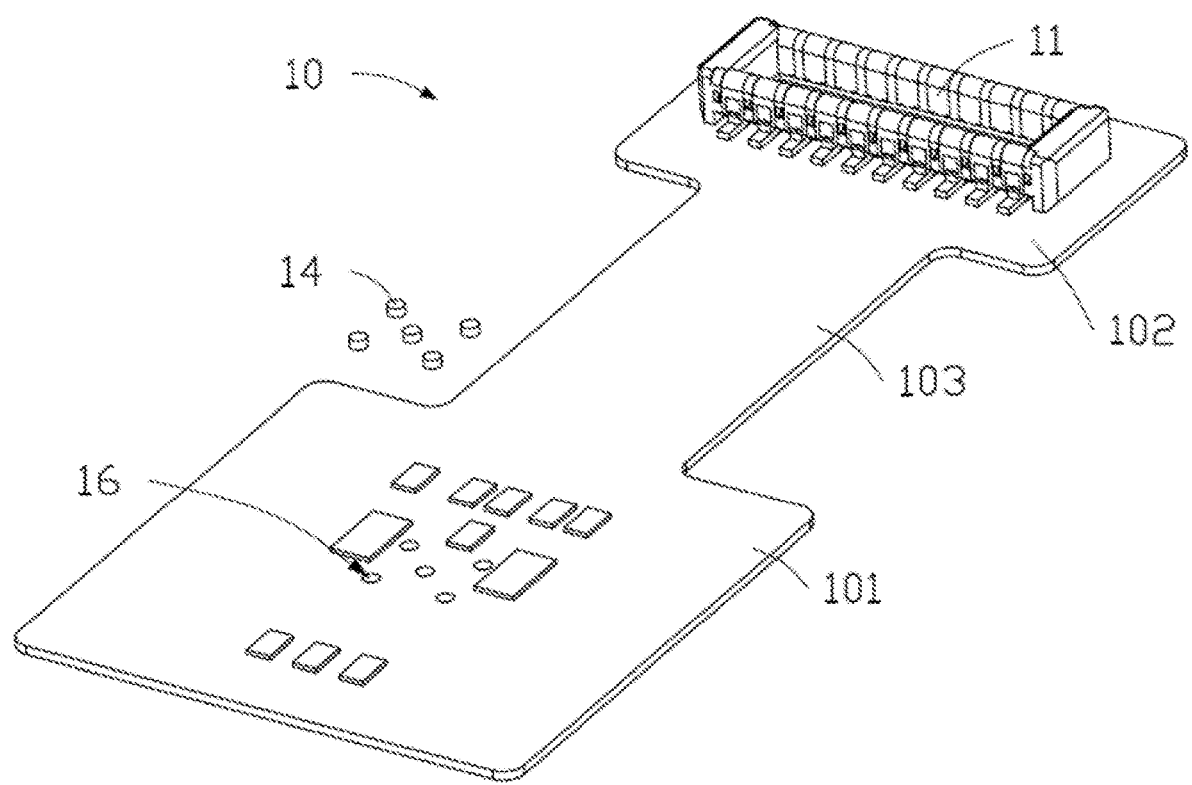
FIG. 11 is an isometric view of a circuit board of the optical projection module of FIG. 9.

FIGS. 9 to 11 illustrate a third embodiment of an optical projection module 300. Different from the optical projection modules 100 and 200, the semiconductor substrate 20 of the optical projection module 300 defines a plurality of first through holes 26 aligned with the light source 20. Each first through hole 26 passes through the semiconductor substrate 20. The first rigid board portion 101 defines a plurality of second through holes 16 aligned with the first opening 25. Each second through hole 16 passes through the first rigid board portion 101. The first through holes 26 and the second through holes 16 correspond to each other one-to-one in at least one of number and position. The second through holes 16 are independent from conductive wires of the circuit board 10, that is, the second through holes 16 do not destroy the conductive wires of the circuit board 10.

In an embodiment, each first through hole 26 and each second through hole 16 are substantially circular. The first through holes 26 may number five, and correspond to four corners and a center of the light source 30. A first silical gel 23 infills each first through hole 26. A second silical gel 14 infills each second through hole 16.

When the optical projection modules 100, 200, and 300 are working, the heat generated by the light source 30 is delivered to the outside environment through the hollow areas (that is, the slots of the first embodiment, or the openings of the second embodiment, or the through holes of the third embodiment) defined in the semiconductor substrate 20 and the circuit board 10. Thus, there is less heat buildup in the immediate area of the optical projection modules 100, 200, and 300 is reduced, preventing the temperature of the modules 100, 200, and 300 from reaching levels that cause distortion of the light beams emitted by the light source 30. By not causing, or substantially reducing, distortion of the light beams emitted by the light source 30, the projective properties of the modules 100, 200, and 300 are improved.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An optical projection module comprising:
   a circuit board having a first surface and a second surface, opposite the first surface;
   a semiconductor substrate mounted on the first surface of the circuit board, the semiconductor substrate having a third surface facing the first surface and a fourth surface opposite to the third surface;
   a light source mounted on the fourth surface of the semiconductor substrate; and
   an optical member mounted on the fourth surface of the semiconductor substrate, the light source received in the optical member;
   wherein, each of the circuit board and the semiconductor substrate defines a hollow area, the hollow area is aligned with the light source, the hollow area passes through the circuit board and the semiconductor substrate.

2. The optical projection module of claim 1, wherein the hollow area of the semiconductor substrate comprises a plurality of parallel first slots, the hollow area of the circuit board comprises a plurality of parallel second slots, and the parallel first slots and the parallel second slots correspond to each other one-to-one in at least one of number and position.

3. The optical projection module of claim 1, wherein the hollow area of the semiconductor substrate comprises a first opening, the hollow area of the circuit board comprises a second opening, the first opening has a shape the same as the shape of the light source, and a width of the first opening is less than a width the light source to allow edges defining the first opening to support the light source.

4. The optical projection module of claim 1, wherein the hollow area of the semiconductor substrate comprises a plurality of first through holes, the hollow area of the circuit board comprises a plurality of second through holes, the first through holes and the second through holes correspond to each other one-to-one in at least one of number and position, and the first through holes number five and correspond to four corners and a center of the light source.

5. The optical projection module of claim 1, wherein a silica gel infills the hollow area.

6. The optical projection module of claim 1, wherein the circuit board is a rigid-flexible circuit board which comprises a first rigid board portion, a second rigid board portion, and a flexible board portion connected between the first rigid board portion and the second rigid board portion, the hollow area is defined in the first rigid board portion, and an electronic connecting component is mounted on the second rigid board portion.

7. The optical projection module of claim 6, wherein a reinforcing plate is connected to the second surface of the circuit board by a first adhesive layer, and the reinforcing plate is made of metal.

8. The optical projection module of claim 6, wherein the semiconductor substrate is connected to the first rigid board portion by a solder paste layer, and the semiconductor substrate is made of ceramic.

9. The optical projection module of claim 1, wherein the light source is connected to a center of the fourth surface of the semiconductor substrate by a second adhesive layer, and the light source is a vertical cavity surface emitting laser.

10. The optical projection module of claim 1, wherein the optical member comprises a lens holder, a collimation lens, and a diffraction optical element, the collimation lens and the diffraction optical element are mounted in the lens holder, the lens holder is connected to the semiconductor substrate by a third adhesive layer, the lens holder defines a receiving space for receiving the light source.

11. The optical projection module of claim 10, wherein the lens holder comprises a first holding portion and a second holding portion, the first holding portion is connected to the semiconductor substrate, the first holding portion has a fifth surface facing the third surface and a six surface opposite to the fifth surface, the second holding portion is connected to the fifth surface of the first holding portion, a width of the first holding portion is greater than a width of the second holding portion, the receiving space is defined in the first holding portion, the collimation lens is positioned between the first holding portion and the second holding portion, and closes off an end of the receiving space opposite from the semiconductor substrate, the second holding portion has a seventh surface facing the sixth surface and an eighth surface opposite to the seventh surface, the eighth surface of the second holding portion defines a recess for receiving the diffraction optical element.

12. The optical projection module of claim 11, further comprising a protection cover, wherein the protection cover covers the eighth surface of the second holding portion to close off the recess.

* * * * *